United States Patent [19]

Whisler

[11] 3,999,130
[45] Dec. 21, 1976

[54] AUTOMATIC FREQUENCY TRANSLATOR FOR USE WITH A DELAY/AMPLITUDE EQUALIZER

[75] Inventor: Norman L. Whisler, Fort Wayne, Ind.

[73] Assignee: The Magnavox Company, Fort Wayne, Ind.

[22] Filed: Feb. 21, 1975

[21] Appl. No.: 527,677

[52] U.S. Cl. .............................................. 325/433
[51] Int. Cl.² ......................................... H03D 7/16
[58] Field of Search .......... 325/329, 330, 431, 442, 325/446, 431, 432, 433, 323, 42; 329/122, 124; 332/44, 45; 321/60

[56] References Cited
UNITED STATES PATENTS

| | | | |
|---|---|---|---|
| 3,361,976 | 1/1968 | Konian | 325/432 X |
| 3,754,101 | 8/1973 | Daspit et al. | 325/50 |
| 3,938,061 | 2/1976 | Levasseur | 332/45 |

*Primary Examiner*—Benedict V. Safourek
*Attorney, Agent, or Firm*—Thomas A. Briody; Joe E. Barbee; William J. Streeter

[57] ABSTRACT

Apparatus for use with a controller of a delay/amplitude equalizer. The disclosed apparatus supplies a reference signal with a frequency offset component identical in amplitude and phase to an offset frequency of the received signal. The availability of a received signal and a reference signal permits setting tap weight in the tapped delay line of the transversal filter of a delay/amplitude equalizer.

3 Claims, 4 Drawing Figures

AUTOMATIC FREQUENCY TRANSLATOR FOR USE WITH A DELAY/AMPLITUDE EQUALIZER

BACKGROUND OF THE INVENTION

1. Field of the Invention

This invention relates generally to the operation of a delay/amplitude equalizer device, and more particularly to apparatus for providing signals needed to adjust the tap weights of taps in a transversal delay line.

2. Description of the Prior Art

The necessity for the correction of constant frequency-independent frequency shifts, generally referred to as frequency offset, is well known in the prior art. For example, sine waves of 500 Hz, 1500 Hz and 2500 Hz (i.e., a fundamental, third and fifth harmonic) can be combined, when the phases and relative amplitudes are correctly specified to approximate a square wave. However, when the frequency offset is 5 Hz, for example, the resulting signals of 505 Hz, and 1505 Hz and 2505 Hz do not provide for a simple reconstruction of a square wave. For certain types of transmitted information, a distortion of this type can produce intolerable error.

In a delay/amplitude equalizer device, corrections are performed by comparing a received reference signal with a similar generated internal reference signal. The delay/amplitude equalizer device provides apparatus for reconstructing the received signal so that spectrum of the received signal is approximately equivalent with the spectrum of the internally generated signal. In particular this spectral reconstruction is typically accomplished by correctly weighting taps on a transversal filter tapped delay line.

In order to eliminate the offset frequency error in a received signal, an offset frequency signal can be introduced into the reference signal, or the offset frequency components can be eliminated from the received signal. Further, the received signal plus reference signal with offset frequency added combination or the corrected received signal plus reference signal can be utilized by the circuits controlling the delay tap weights to provide desired correction.

In the prior art, the offset frequency has typically been eliminated from the received signal for providing signals determining the weighting of the filter taps. This procedure has several disadvantages. Apparatus required to implement this correction (i.e. such as single sideband filters) are typically complex and expensive. Furthermore, the filter can introduce delay distortion which degrades the received signal and complicates the equalization process. In addition, the phase-locked loop can be sensitive to noise and to (external or internal) phase instability. Consequently, the signal integrity can be compromised. Finally, the correction apparatus, such as filtering apparatus, is still present even when the offset correction is not required.

The offset frequency can be corrected by providing digitized circuits and converting the incoming signals to digitally encoded signals. The digitally encoded signals can then be processed and in this manner the delay distortion can be minimized. However, the complexity resulting from the requirement for a single sideband filter and a low pass band filter remains.

In applications such as a delay/line equalizer, the portion of the circuit used to achieve equalization can generally be utilized on a small portion of the total operating time. After the controller has serviced one equalizer, it is available to service another equalizer. If the circuitry used for correcting the offset frequency can be changed from the equalizer to the controller, a proportionate saving in apparatus can be achieved. This can be done by introducing the same amount and polarity of offset into the reference signal as exists in a received signal channel. This will have the further advantage that when the controller is no longer required by a given equalizer, the impairment, caused by the offset correction, is eliminated.

It is therefore an object to provide an improved delay/amplitude equalizer.

It is a further object to provide apparatus for controlling a plurality of delay/amplitude equalizers which can be shared among the plurality of equalizers.

It is a more particular object of the present invention to provide a reference signal with an offset frequency component determined by the offset frequency component of a received signal.

SUMMARY OF THE INVENTION

The aforementioned and other objects are accomplished according to the present invention by apparatus for determining an offset frequency of a received signal, and apparatus for applying the determined offset frequency to a reference signal with the same amplitude and phase as the offset frequency of the received signal.

A phase-locked loop is utilized to track the received signal. A component of the tracked signal component is determined to be caused by the offset frequency. The identified component is then added to a reference signal in the corrected amplitude and phase as the offset frequency component of the received signal.

These and other features of the invention will be understood by reading the following description along with the drawings.

DESCRIPTION OF THE PREFERRED EMBODIMENT

Detailed Description of the Figures

Figure 1:
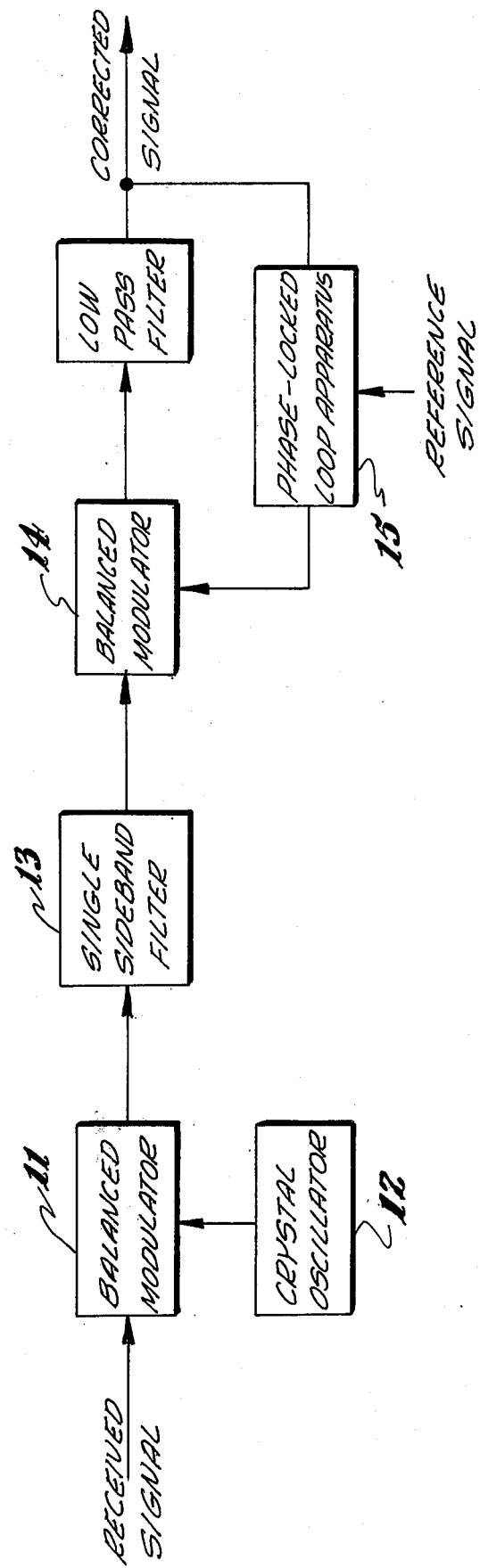
FIG. 1 shows apparatus for eliminating an offset frequency from a received signal according to the prior art.

Referring now to FIG. 1, apparatus for eliminating an offset frequency from a received signal according to the prior art is shown. A received signal is applied to balanced modulator 11. The output signal from crystal oscillator 12 is also applied to balanced modulator 11. The received signal is mixed in balanced modulator 11 with the crystal oscillator signal, providing an output signal with upper and lower sideband frequency components. Single sideband filter 13 receives the mixed signal and selectively transmits one of the sideband frequency signals.

The selectively transmitted sideband frequency signal is applied to a first input terminal of a balanced modulator 14. The output signal of balanced modulator 14 is applied through a low pass filter 16 to an output terminal and provides the corrected signal. The corrected or low pass filter output signal is applied to a first input terminal of phase-locked loop apparatus 15 while a second input terminal of phase-locked loop apparatus 15 receives a reference signal. The phase-locked loop compares the signal having the offset frequency translation to the reference signal frequency. The signal resulting from the comparison of the reference signal and the corrected signal is applied to a second input terminal of the balanced modulator 14. The offset frequency is thereby eliminated from the corrected signal.

Figure 2:
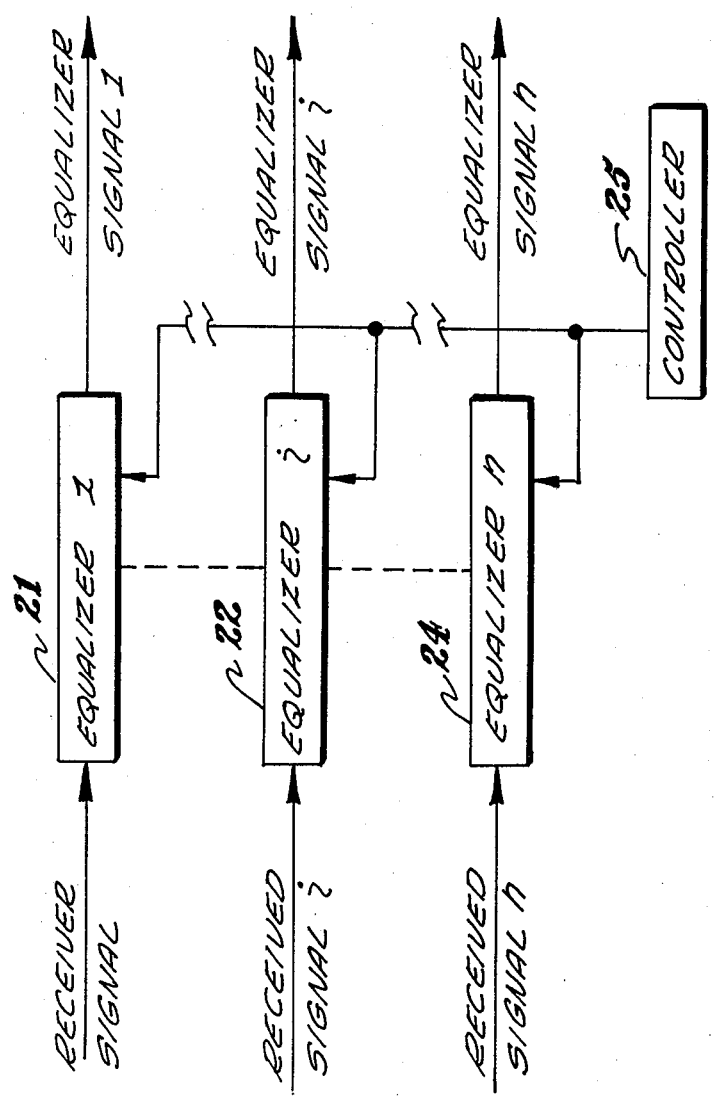
FIG. 2 shows the use of the shared controller in which the apparatus of the present invention is utilized.

Referring now to FIG. 2, a block diagram showing the sharing of controller apparatus 25 used in equalization of received signals is shown. By having a controller 25 shared among n equalizing circuits (i.e., 1 through i through n) a saving of apparatus can be effected. Thus, according to a preselected program, controller 25 will cause the equalizer 1 through equalizer i through equalizer n to provide an equalized output signal for received signals applied to each equalizer. However, not all methods of providing a signal corrected for an offset frequency by controlling an equalizer with a shared controller can be effectively employed. In the preferred embodiment, the controller introduces into the reference signal a frequency component substantially identical in amplitude and phase to the received signal.

Figure 3:
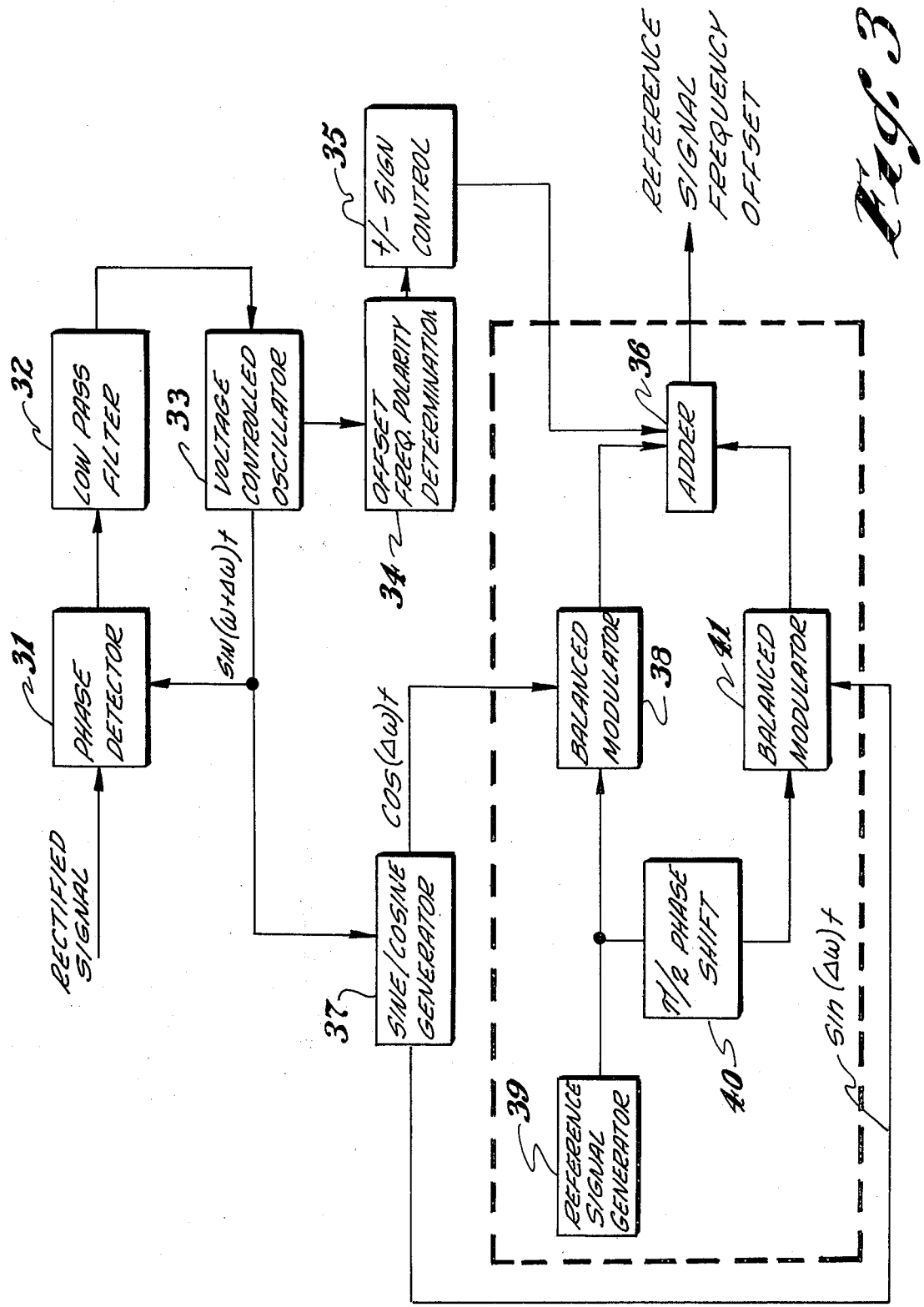
FIG. 3 shows a first embodiment for providing a reference signal to which the receiver signal offset frequency component has been added.

Referring now to FIG. 3, apparatus for providing a reference signal with an offset frequency component found in a received signal is shown. The received channel signal, in which an offset frequency of $\Delta\omega$ is present, is applied to phase detector 31. The output signal of phase detector 31 is applied through low pass filter 32 to an input terminal of voltage controlled oscillator 33. An output signal of voltage controlled oscillator 33 is applied to a second input terminal of phase detector 31 and to an input terminal of sine/cosine generator 37. Sine/cosine generator 37 contains an internal clock permitting the substantives [$\cos(\Delta\omega)t$ and $\sin(\Delta\omega)t$] to be extracted from the predetermined phase-lock component [$\sin(\omega+\Delta\omega)t$].

A cosine signal from sine/cosine generator 37 is applied to an input terminal of balanced modulator 38 while a sine signal from sine/cosine generator is applied to an input terminal of balanced modulator 41. A signal from reference signal generator 39 is applied to a second input terminal of balanced modulator 38 and to an input terminal of $\pi/2$ phase shift apparatus 40. The signal from $\pi/2$ phase shift 40 is applied to a second input terminal of balanced modulator 41. An output signal from balanced modulator 38 is applied to a first input terminal of adder 36, while an output signal of balanced modulator 41 is applied to a second input terminal of adder 36.

An output signal from voltage controlled oscillator 33 is applied to an input terminal of offset frequency polarity determination apparatus 34. An output signal of offset frequency determination 34 is applied to an input terminal of $\pm$ sign control apparatus 35 while an output terminal of $\pm$ sign control apparatus 35 is applied to adder 36. An output terminal of adder 36 supplies the reference signal with the frequency offset.

Figure 4:
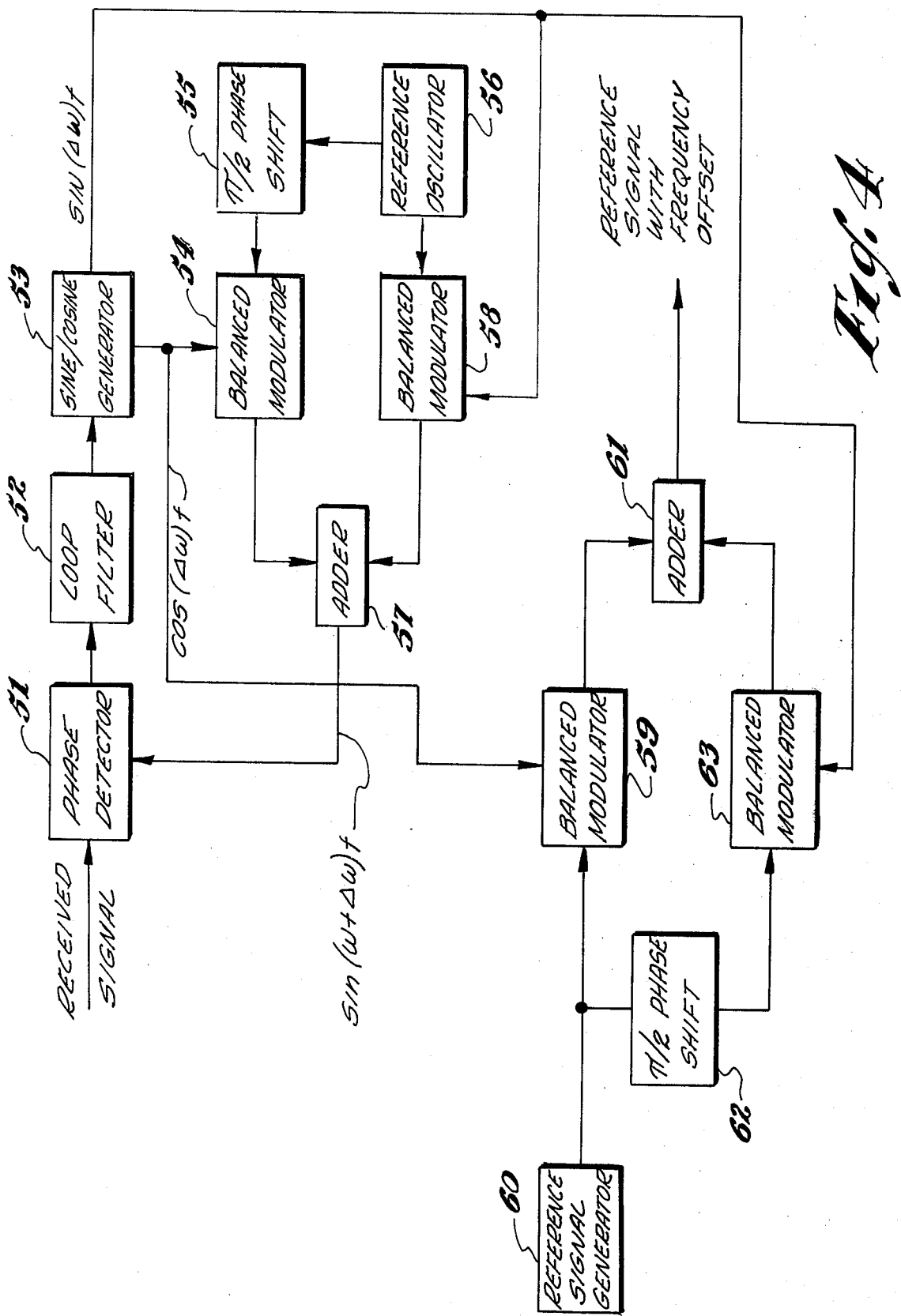
FIG. 4 shows a second embodiment for providing a reference signal to which the receiver signal offset frequency has been added.

Referring now to FIG. 4 a received signal is applied to a first input terminal of phase detector 51. The output terminal of phased detector 51 is applied to loop filter 52. The output signal of loop filter 52 is applied to sine/cosine generator 53. A first output terminal of sine/cosine generator 53 is applied to an input terminal of balanced modulator 63, while a second output terminal of sine/cosine generator 53 is applied to a first input terminal of a balanced modulator 59 and to a first input terminal of balanced modulator 54. A second input terminal of balanced modulator 54 receives an output signal of a reference oscillator 56 transmitted through $\pi/2$ phase shift apparatus 55. The output signal of reference oscillator 56 is also applied to one input terminal of balanced modulator 58. Output signals of balanced modulator 54 and balanced modulator 58 are applied to input terminals of adder 57. An output terminal of adder 57 is applied to a second input terminal of phase detector 51.

An output signal from reference signal generator 60 is applied to a second input terminal of balanced modulator 59 and is applied after transmission through a $\pi/2$ phase shift apparatus 62 to a second input terminal of balanced modulator 63. Output signals of balanced modulator 59 and balanced modulator 63 are applied to input terminals of adder 61. The output signal of adder 61 is a reference signal with a frequency offset.

OPERATION OF THE PREFERRED EMBODIMENT

In FIG. 1, apparatus for removing an offset frequency component from a received signal according to the prior art is shown. A signal from a crystal oscillator is used to modulate a received signal. A single sideband filter transmits only one sideband of the resulting signal. The resulting single sideband signal is compared with a reference signal in a phase-locked loop with a low pass filter. The resulting output signal has the offset frequency component removed.

The above described apparatus is employed in the prior art to control the weighted taps of a tapped delay line in a delay/amplitude equalizer. Each equalizer would typically contain such a circuit with the disadvantages previously described.

In FIG. 2, the control of the weighted taps of the equalizer are entirely controlled by apparatus in the shared controller 25. When the controller utilizes the received signal and a reference signal with an offset frequency component identical to the offset frequency component of the received signal, all of the apparatus, especially the apparatus producing the reference signal with offset can be located in the controller. The received signal and reference signal with offset frequency component are utilized by the controller to determine the weights of the delay line taps of the addressed equalizer.

The apparatus of FIG. 3 can be utilized to provide a reference signal with an offset frequency component substantially identical to that of a received signal. Phase detector 31, low pass filter 32 and voltage controlled oscillator 33 provide a phase-locked loop of a signal of the form $\sin(\omega + \Delta\omega)t$ where $\omega$ is a component frequency of the reference frequency spectrum and $\Delta\omega$ is the amplitude of the offset frequency component. The sine/cosine function generator after removing the $\omega$ component, (i.e. by means of an internal oscillator at the spectral frequency being tracked by the phase-locked loop) generates a $\sin\Delta\omega t$ and a $\cos\Delta\omega t$ component which are added in a symmetrical manner to the output of the reference signal generator. However, to insure that the signals from balanced modulators 38 and 41 are correctly combined it is necessary to determine how to combine the output signals of the modulators. The offset frequency polarity determination 34 must determine from the output of the voltage controlled oscillator the polarity of the offset frequency. The polarity is then signalled to ± sign control apparatus 35 which controls the combining of the output signals of modulators 38 and 41. However, the apparatus for determining the polarity can be sensitive to drift and error, likely to occur at smaller offset frequency providing twice the error, when the output signals of modulators 38 and 41 are combined.

The disadvantages of the apparatus of FIG. 3 are overcome by the apparatus shown in FIG. 4. A phase-locked loop is again locked on the sin $(\omega+\Delta\omega) t$ signal. However, in this case an output of the sine/cosine generator is part of the loop, and a cos $\Delta\omega t$ signal is added to a signal of the frequency $\omega$ produced by references oscillator to complete the loop. The output signals are now combined in the manner shown in FIG. 3, however, the combination of the signals at adder 61 automatically possesses the correct sign. The output signal of the adder is thus the reference signal with an offset frequency component added.

The above description has included the operation of the preferred embodiment and is not meant to limit the scope of the invention. The invention is to be limited only by the following claims. From the above discussion, many variations will be apparent to one skilled in the art that would yet be accomplished by the spirit and scope of the invention.

What is claimed is:

1. Apparatus for providing a reference signal with an offset frequency component of a received signal, comprising: means for providing a phase-locked loop, said means for providing a phase-locked loop having an output providing a signal with a combination of a given frequency component and an offset frequency component; means for determining whether said combination frequency is greater than said given frequency, said means for determining connected to the output of said means for providing; means for generating a first and a second sinusoidal signal of said offset frequency, said means for generating being connected to the output of said means for providing; first modulator means for combining the first sinusoidal signal of said offset frequency with a reference signal; a $\pi/2$ degree phase shifter that produces a phase shifted reference signal and having an output; second modulator means for combining the second sinusoidal component of said offset frequency with the phase shifted reference signal; and means for combining output signals from said first modulator means and said second modulator means responsive to signals from said determining means for use with a delay/amplitude equalizer.

2. Apparatus for providing a reference signal with an offset frequency component of a received signal, comprising: means for providing a phase-locked loop for a signal with a frequency determined by a combination of a reference frequency and an offset frequency, said means for providing including means for modulating a signal of said reference frequency with a sinusoidal signal of said offset frequency; first modulator means for combining a second reference signal with a first signal of said offset frequency provided by said means for providing; a phase shifter for phase shifting the second reference signal a predetermined amount; second modulator means for combining the phase-shifted reference signal with a second signal of said offset frequency provided by said means for providing; and means for combining an output signal of said first combining means with an output signal of said second combining means for use in a delay/amplitude equalizer.

3. An automatic frequency translator for use with a delay/amplitude equalizer having as an input a received signal with a frequency offset, the translator comprising:
a phase-locked loop that has as an input the received signal with a frequency offset, the phase-locked loop having a reference oscillator and a sine/cosine generator to generate a sine function of the offset frequency and a cosine function of the offset frequency;
a first modulator that combines the cosine function with a reference signal;
a phase shifter that shifts the reference signal a predetermined amount to produce a phase shifted reference signal;
a second modulator that combines the sine function with the phase shifted reference signal; and
means to sum the first modulator and second modulator outputs to produce a signal for use with the equalizer.

* * * * *